(12) United States Patent
O'Connor et al.

(10) Patent No.: US 9,436,398 B2
(45) Date of Patent: *Sep. 6, 2016

(54) MEMORY INTERFACE SUPPORTING BOTH ECC AND PER-BYTE DATA MASKING

(71) Applicant: Advanced Micro Devices, Inc., Sunnyvale, CA (US)

(72) Inventors: James O'Connor, Austin, TX (US); Warren Kruger, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/728,438

(22) Filed: Jun. 2, 2015

(65) Prior Publication Data

US 2015/0261472 A1    Sep. 17, 2015

Related U.S. Application Data

(63) Continuation of application No. 13/722,716, filed on Dec. 20, 2012, now Pat. No. 9,064,606.

(51) Int. Cl.
| | |
|---|---|
| *G11C 7/10* | (2006.01) |
| *G06F 3/06* | (2006.01) |
| *G06F 11/10* | (2006.01) |
| *G11C 29/00* | (2006.01) |
| *G11C 29/04* | (2006.01) |

(52) U.S. Cl.
CPC ............ *G06F 3/0619* (2013.01); *G06F 3/0659* (2013.01); *G06F 3/0673* (2013.01); *G06F 11/1052* (2013.01); *G11C 7/1006* (2013.01); *G11C 7/1009* (2013.01); *G11C 29/76* (2013.01); *G11C 2029/0411* (2013.01)

(58) Field of Classification Search
CPC ..................................................... G11C 7/1006
USPC ............................................................ 714/763
See application file for complete search history.

(56) References Cited

U.S. PATENT DOCUMENTS

| | | | |
|---|---|---|---|
| 2006/0123320 A1* | 6/2006 | Vogt ................. | G11C 5/04 714/762 |
| 2006/0265546 A1* | 11/2006 | Ganfield ............ | G11C 7/1006 711/105 |
| 2008/0195919 A1* | 8/2008 | Park .................. | G06F 11/1044 714/796 |
| 2010/0268901 A1 | 10/2010 | Shaeffer | |
| 2013/0132799 A1* | 5/2013 | Zhu .................... | G06F 11/1048 714/768 |
| 2013/0219134 A1* | 8/2013 | Macri ................ | G06F 13/4234 711/154 |
| 2013/0268901 A1* | 10/2013 | Lu ..................... | G03F 1/36 716/52 |
| 2013/0275830 A1* | 10/2013 | Park .................. | H03M 13/09 714/758 |

* cited by examiner

*Primary Examiner* — Min Huang
(74) *Attorney, Agent, or Firm* — Volpe and Koenig, P.C.

(57) ABSTRACT

A memory and a method of storing data in a memory are provided. The memory comprises a memory block comprising data bits and additional bits. The memory includes logic which, when receiving a first command, writes data into the data bits of the memory block, wherein the data is masked according to a first input. The logic, in response to a second command, writes data into the data bits of the memory block and writes a second input into the additional bits of the memory block.

10 Claims, 9 Drawing Sheets

MEMORY INTERFACE SUPPORTING BOTH ECC AND PER-BYTE DATA MASKING

CROSS REFERENCE TO RELATED APPLICATION(S)

This application is a continuation of U.S. patent application Ser. No. 13/722,716, filed Dec. 20, 2012, which is incorporated by reference as if fully set forth.

BACKGROUND

1. Field

The embodiments are generally directed to semiconductor devices, and more specifically to semiconductor memory devices.

2. Background Art

Modern computing systems may be configured to use a particular type of memory depending on the type of data they are handling. For example, computing systems processing advanced graphics typically need to write data to memory at a high rate, with little concern for minor errors in the data. These systems rely on data-masking in order to decrease the amount of bits that have to be written to memory and therefore decrease write delays. On the other hand, systems such as transaction servers may require high data integrity at the expense of some write delay. High reliability systems employ error-correcting codes in order to ensure data integrity. Because one type of memory may not be suitable for all data processing, switching a system to process a different type of data may require changing the system's memory. Having to change a system's memory in order to change its processing function can be time consuming and lead to undesired costs and inefficiencies.

SUMMARY OF EMBODIMENTS

A memory and a method of storing data in a memory are provided. The memory comprises a memory block comprising data bits and additional bits. The memory includes logic that, when receiving a first command, writes data into the data bits of the memory block, wherein the data is masked according to a first input. The logic, in response to a second command, writes data into the data bits of the memory block and writes a second input into the additional bits of the memory block.

Further features and advantages of the embodiments, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the embodiments and, together with the description, further serve to explain the principles of the embodiments and to enable a person skilled in the pertinent art to make and use the embodiments. Various embodiments are described below with reference to the drawings, wherein like reference numerals are used to refer to like elements throughout.

DETAILED DESCRIPTION

In the detailed description that follows, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The term "embodiments" does not require that all embodiments include the discussed feature, advantage or mode of operation. Alternate embodiments may be devised without departing from the scope of the disclosure, and well-known elements of the disclosure may not be described in detail or may be omitted so as not to obscure the relevant details. In addition, the terminology used herein is for the purpose of describing particular embodiments only and is not intended to be limiting of the disclosure. For example, as used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
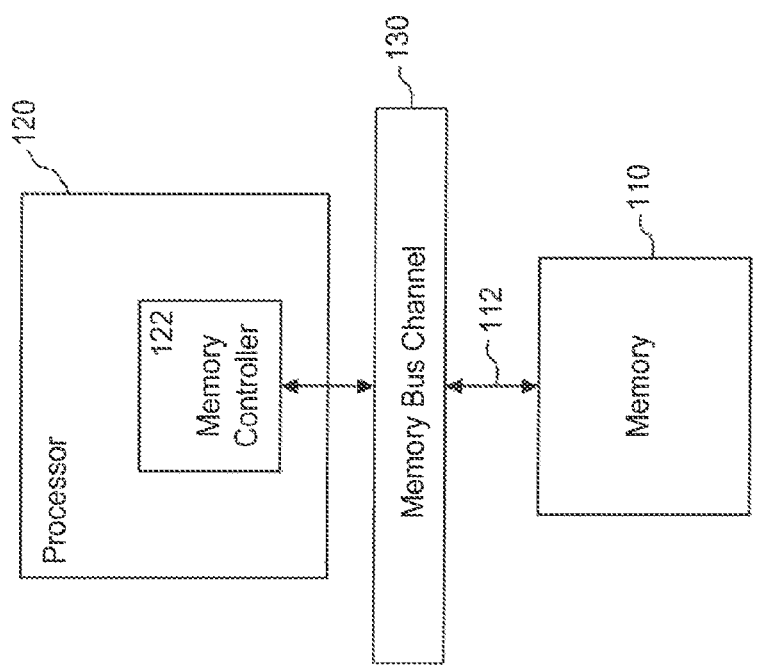
FIG. 1 is a system diagram of an operating environment for a memory device, according to an embodiment.

FIG. 1 of the drawings depicts an exemplary operating environment 100 for a memory device, according to an embodiment. Memory operating environment 100 contains memory device 110, processor 120 and memory bus channel 130.

Memory device 110 is a piece of semiconductor hardware which stores and loads data in response to electronic signals carrying instructions. Memory device 110 may be volatile and non-volatile memory. Examples of volatile memory include a random access memory (RAM). Volatile memory typically stores data as long as the electronic device receives power. Examples of non-volatile memory include read-only memory, flash memory, ferroelectric RAM (F-RAM), hard disks, floppy disks, magnetic tape, optical discs, etc. Non-volatile memory retains its memory state when the electronic device loses power or is turned off.

Processor 120 is a piece of hardware within a computing device which carries out instructions executing computer programs or applications. Processor 120 carries out instructions by performing arithmetical, logical and input/output operations specified by computer programs or applications. In an embodiment, processor 120 reads data from and writes data to memory 110 as part of program or application execution.

Processor 120 includes a memory controller 122. Memory controller 122 is a component of processor 120 which communicates with memory 110. For example, memory controller 122 sends signals to, and reads data from, memory 110. Although in the illustrative embodiment the memory controller is depicted as part of the processor, those skilled in the relevant arts will understand that the memory controller can be separate from the processor.

Memory bus channel 130 is the communication interface on which memory controller 122 and memory 100 transmit signals. Memory bus channel 130 can be a physical interface that establishes a connection between controller 122 and a memory interface 112 of memory 110. In an embodiment, memory interface 112 is connected to memory bus channel 130 through a socket. In an embodiment, memory interface 112 is hardwired to memory bus channel 130.

In an embodiment, processor 120 can read instructions and data from memory 110, perform computations on data, and store resulting data back into memory 110. Memory controller 122 generates signals, which can include commands, addresses and data, among other things, and transmits them through memory bus channel 130 to memory 110. Memory controller 122 also receives signals from memory 110 which can include data or status information, among other things. Signals to and from memory 110 can carry data, instructions, addresses or other information.

Figure 2:
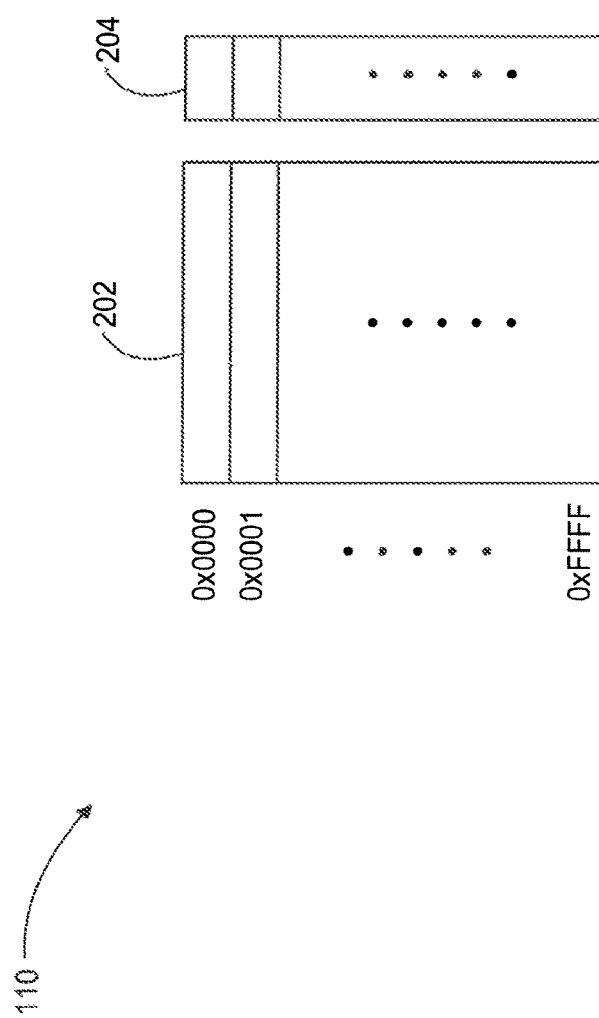
FIG. 2 is a diagram of the data block structure of a memory device, according to an embodiment.

FIG. 2 of the drawings illustrates an exemplary embodiment of semiconductor memory device 110, whose data block structure supports error-correcting codes (ECC) and per-byte data masking. In an embodiment, memory device 110 includes a data section 202 and an ECC section 204. It will be understood that memory device 110 could include other memory sections in addition to the ones disclosed herein.

Data section 202 and ECC section 204 contain individually addressable memory blocks usable to store data. In the illustrative embodiment of FIG. 2, the memory blocks are 16-bit addressable, but it will be understood that they could be addressed using any number of bits. In the illustrative embodiment, memory blocks in data section 202 comprise 64 bits and the memory blocks in ECC section 204 comprise 8 bits. However, it will be understood that the memory blocks could contain any number of bits. Moreover, in an embodiment, data section 202 and ECC section 204 are not distinct sections of memory. For example, memory device 110 may use some of the bits of a memory block to store data and use the remaining bits to store ECC data.

Memory device 110 could be configured and used to store data in data sections 202 and store corresponding error bits in ECC section 204. Error bits can be any information that is computed based on the data and allows detection and/or correction of data corruption caused by, for example, a data bit flipping to the wrong state. Numerous methods of computing error bits are known in the art. By way of example, error bits could be error correction codes or error detection codes such as, for example, a checksum, a cyclic redundancy check (CRC), a Hamming code, a turbo code or a low-density parity-check code (LDPC), among others. In the embodiments disclosed herein, the error bits will be referred to as error-correcting codes (ECC) for illustrative purposes only, and it will be understood that ECC bits may be any kind of additional bits computed by any methods known to those skilled in the relevant arts.

In an embodiment, ECC section 204 could be used to store a parity-bit data, which allows detection of a single-bit error in the data. In an embodiment, ECC section could carry a "don't care" value. Further alternatives to the use of ECC memory 204 will be recognized by those skilled in the relevant arts and are within the scope of the teachings herein.

Figure 3:
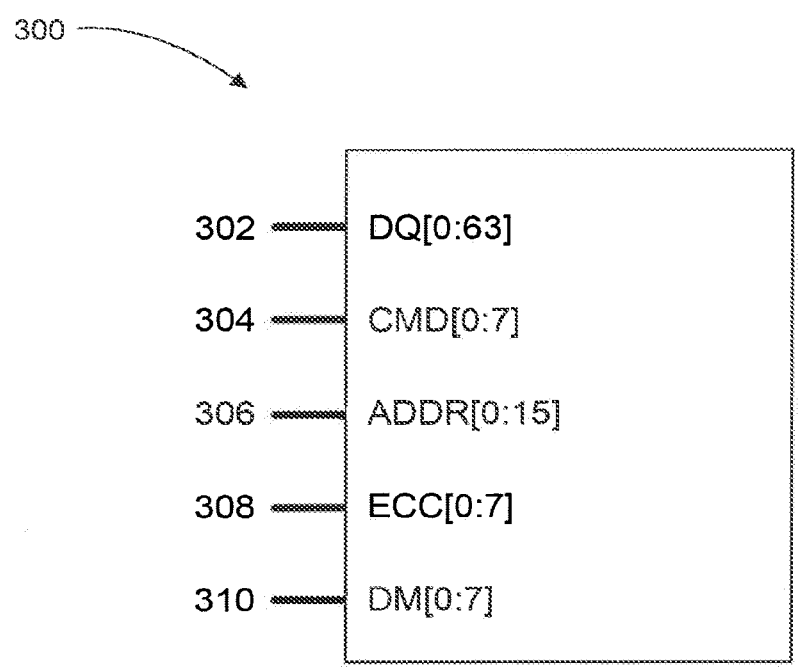
FIG. 3 is a diagram of a memory interface of a memory device supporting ECC and data-masked writes, according to an embodiment.

FIG. 3 of the drawings illustrates an exemplary embodiment of memory interface 112 of memory device 110, which can support ECC and per-byte data masking commands The interface 112 includes a multi-bit data bus (DQ) 302, multi-bit command bus (CMD) 304, a multi-bit address bus (ADDR) 306, a multi-bit ECC bus (ECC) 308 and a multi-bit data-mask bus (DM) 310. Although the memory illustrated comprises a 64-bit word size, 8-bit command, ECC and data-mask sizes and 16-bit address size, it should be understood that interface 112 could contain other bus sizes.

Memory 110 receives and transmits commands, addresses and data through interface 112 and stores data in its memory blocks. For example, memory 202 can receive a command signal on CMD bus 304 to write data signaled on DQ bus 302 to the address signaled on ADDR bus 306 with an ECC value signaled in ECC bus 308. In an embodiment, memory interface 112 can be connected to a memory bus channel 130 to communicate with a memory controller.

Figure 4:
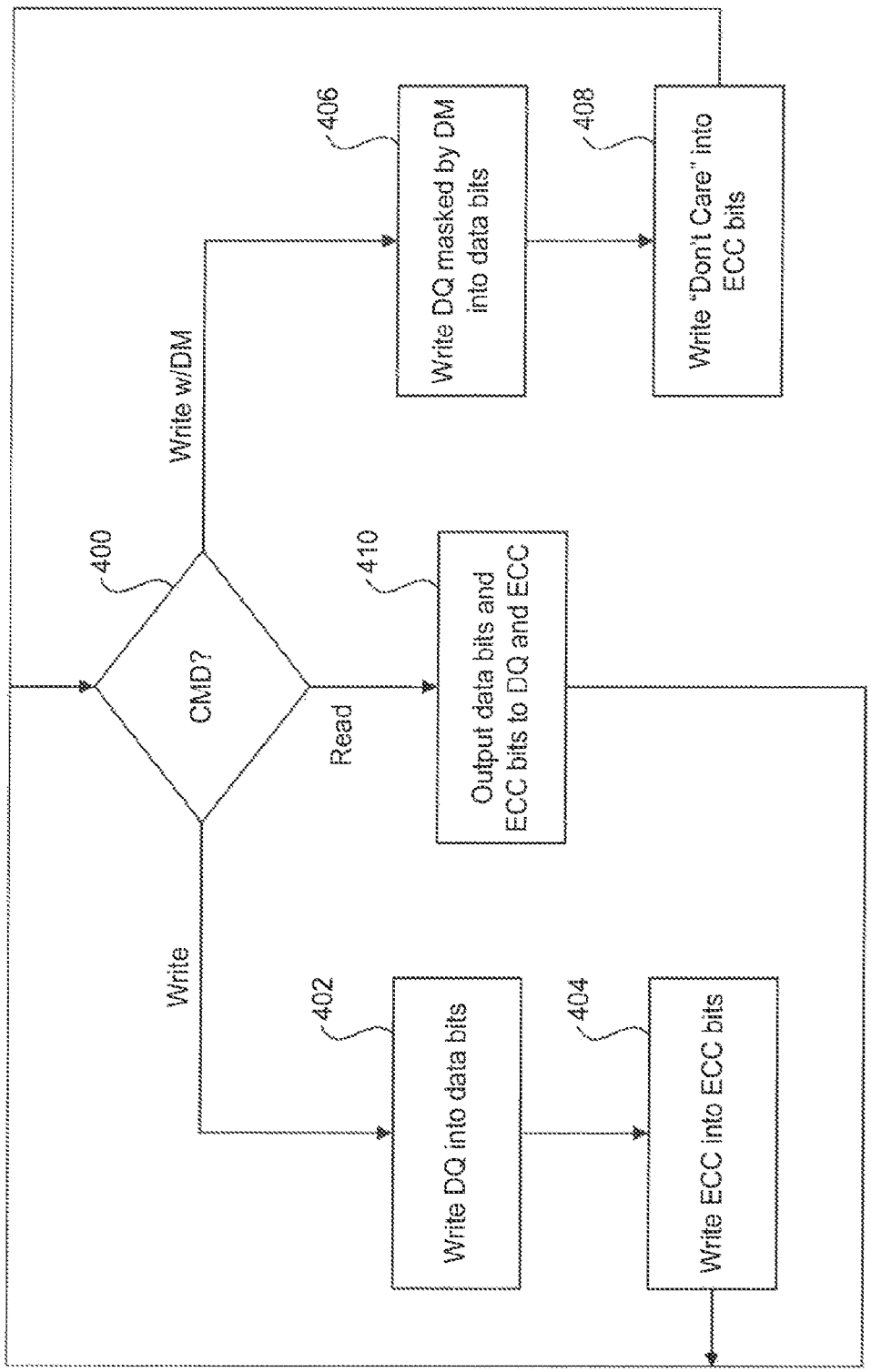
FIG. 4 is a flowchart of a method for storing ECC, data-masked and "don't care" bits into a memory device, according to an embodiment.

FIG. 4 presents a flowchart describing various read and write commands that can be supported by memory 110 in accordance with an embodiment. It will be understood that the commands explained herein are not an exhaustive list of commands that can be supported by memory device 110, and the memory will typically support more commands as will be understood by those skilled in the relevant arts. At step 400, the memory waits for a command. When command bus 304 receives a regular "write" command, the memory device, at step 402, writes the signals in data bus 302 into the data blocks corresponding to the address signaled in address bus 306. At step 404, the memory device writes the signals in ECC bus 308 into the ECC blocks corresponding to the same address. Although presented as separate steps, steps 402 and 404 could occur simultaneously or in a different order than illustrated here.

When command bus 304 receives a "write with data-mask" command, the memory device, at step 406, writes the signals in data bus 302 as masked by the signals in data-mask bus 310 into the data blocks corresponding to the address signaled in address bus 306. A per-byte data-masked write operation, further explained below with reference to FIG. 5, writes only the bytes from the data bus that are signaled by corresponding bits in the data-mask bus. At step 408, the memory device writes "don't care" values into the ECC blocks corresponding to the same address. "Don't care" values can be whatever is simplest or most efficient for the memory, for example, all zeroes or a predetermined bit pattern. In another example, at step 408, the memory device does not write to the ECC blocks. Although presented as separate steps, steps 406 and 408 could occur simultaneously or in a different order than illustrated here.

With continuing reference to FIG. 4, if the command bus receives a "read" command, the memory device, at step 410, outputs the corresponding data bits on the DQ bus and the ECC bits on the ECC bus.

Figure 5:
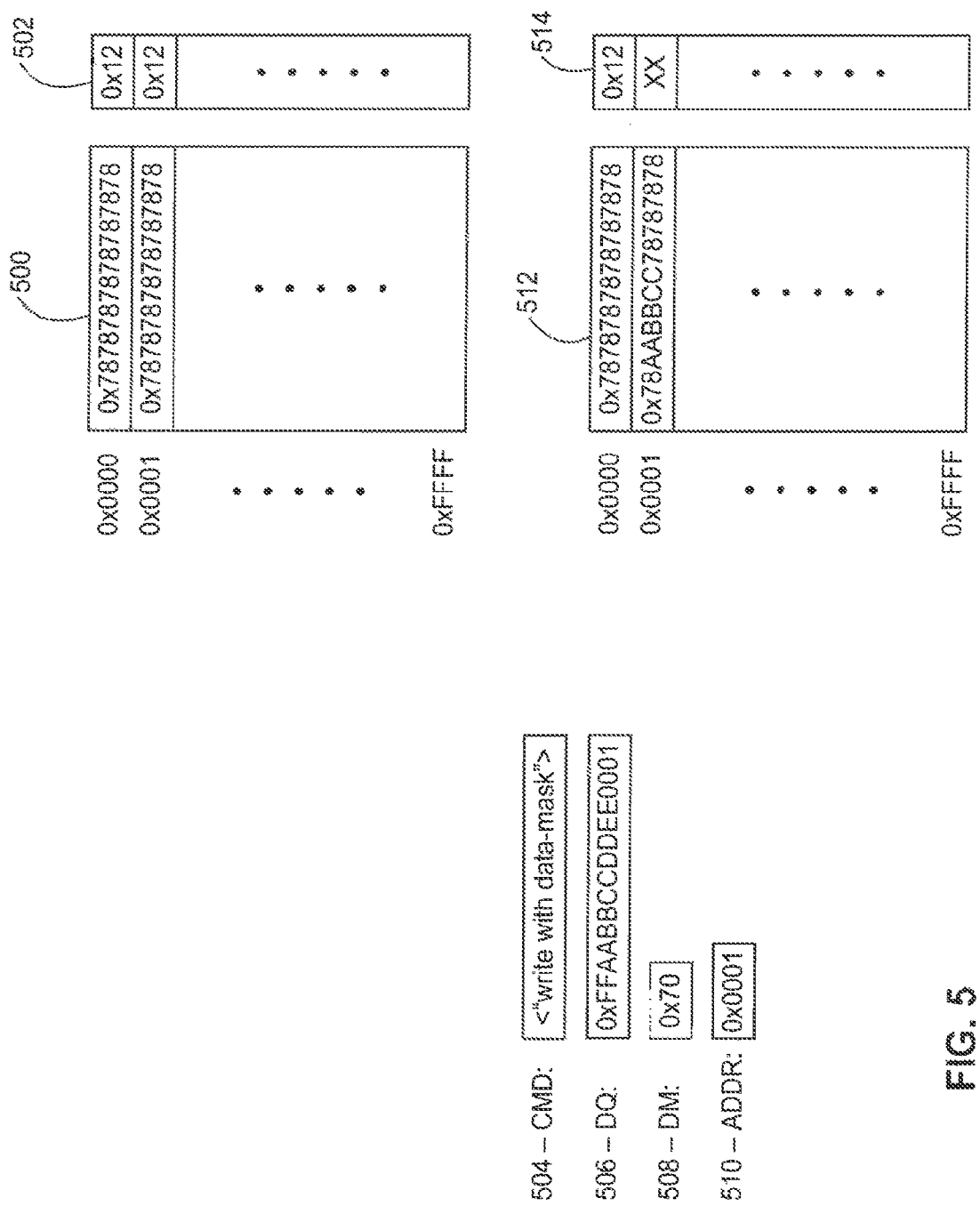
FIG. 5 is a diagram detailing the storage of data-masked bits into a memory device, according to an embodiment.

FIG. 5 illustrates an example of the results of a "write with data-mask" operation on the contents of a memory block in one embodiment. Data section 500 and ECC section 502 depict exemplary initial contents of their memory blocks. The memory receives a "write with data-mask" command 504, along with DQ signal 506 corresponding to a value of 0xFFAABBCCDDEE0011, a DM signal 508 corresponding to a value of 0x70 and an ADDR signal 510 corresponding to address 0x0001. The "write with data-mask" command causes the memory to write the DQ bytes corresponding to the mask bits set to 1. In this case, a mask value of 0x70 (or 01110000) will cause the memory to write the second, third and fourth bytes from the left, while leaving the rest of the memory block with the previous value. Data section 512 depicts the contents of memory block 0x0001 after the exemplary "write with data-mask operation," which in this case would be 0x78AABBCC78787878. ECC section 514 depicts the contents of the ECC memory block after the write operation, which in this case would be "don't care" values, according to one embodiment.

Figure 6:
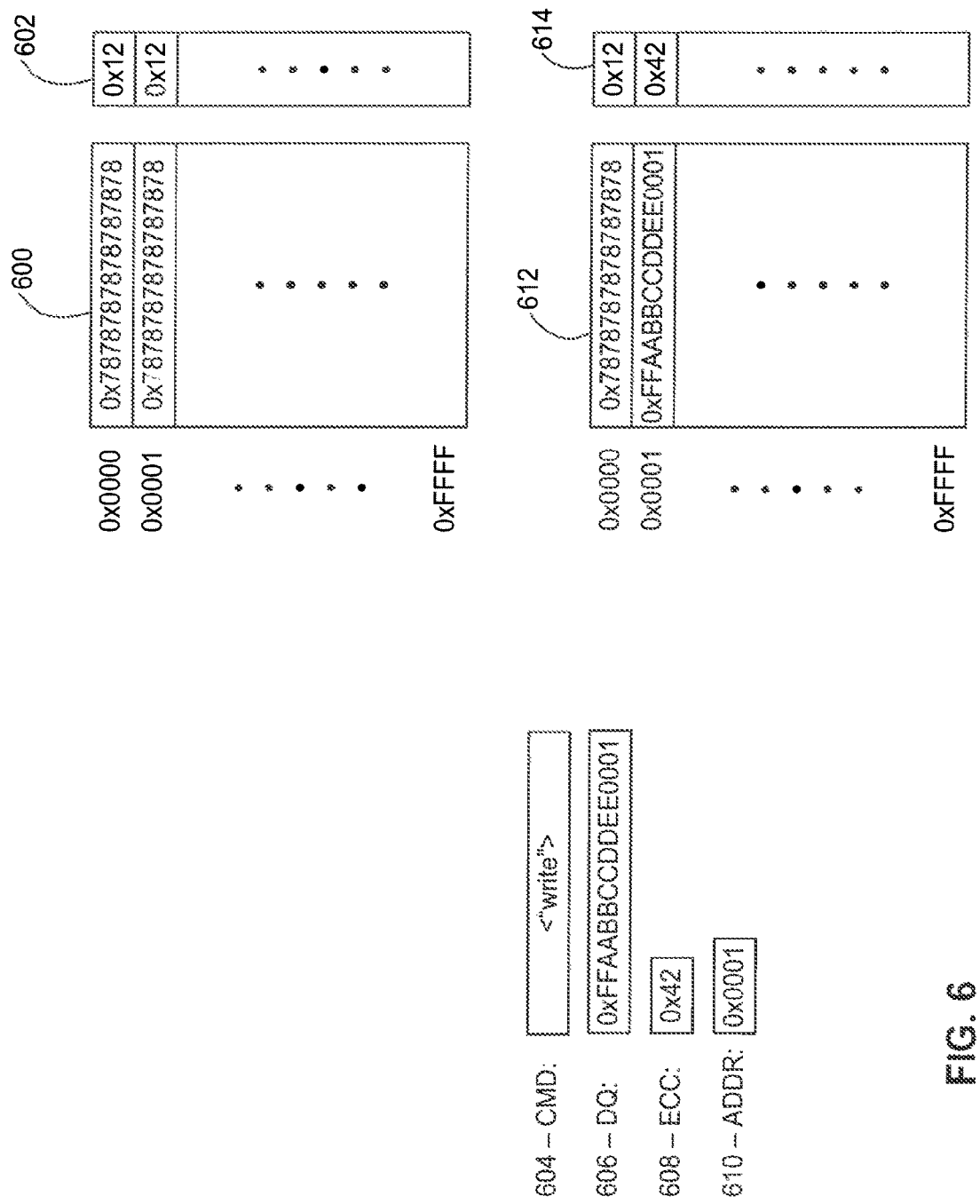
FIG. 6 is a diagram detailing the storage of ECC bits into a memory device, according to an embodiment.

FIG. 6 illustrates an example of the results of a normal "write" operation on the contents of a memory block in one embodiment. Data section 600 and ECC section 602 depict exemplary initial contents of their memory blocks. The memory receives a "write" command 604, along with DQ signal 606 corresponding to a value of 0xFFAABBCCDDEE0011, an ECC signal 608 corresponding to a value of 0x42 and an ADDR signal 610 corresponding to address 0x0001. The "write" command causes the memory to write all of the DQ bytes to the data block signaled in the ADDR input, and the ECC bytes into the ECC block signaled in the ECC input. Data section 612 depicts the contents of memory block 0x0001 after the exemplary "write" operation, which in this case would be 0xFFAABBCCDDEE0001. ECC section 614 depicts the contents of the ECC memory block after the write operation, which in this case would be 0x42.

Figure 7A:
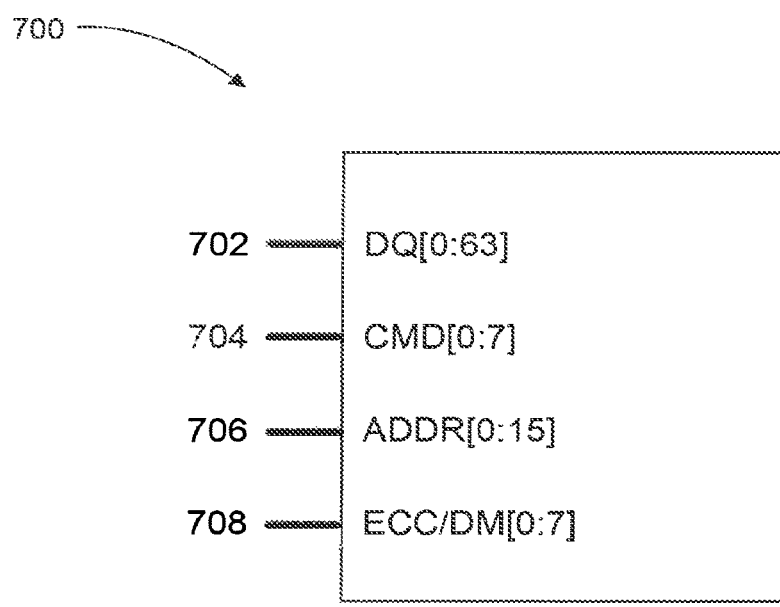
FIG. 7A is a diagram of a memory interface of a memory device supporting ECC and data-masked writes, according to an embodiment.

Referring to FIG. 7A of the drawings, reference numeral 700 illustrates an interface of memory device 110 which can support ECC and per-byte data masking in accordance with an embodiment. The interface 700 includes a multi-bit data bus (DQ) 702, multi-bit command bus (CMD) 704, a multi-bit address bus (ADDR) 706 and a multi-bit ECC/DM bus 708. Although the memory illustrated comprises a 64-bit words size, 8-bit command, ECC and data-mask sizes and 16-bit address size, it should be understood that interface 700 could contain other bus sizes. Memory 110 receives commands through interface 700 and stores data in its memory blocks as further explained with continuing reference to FIG. 7 and with reference to FIG. 8.

In an embodiment using interface 700, the ECC and data-mask signals are merged on the interface into multi-bit ECC/DM bus 708. The write command sent to the memory determines what the signals in ECC/DM bus 708 are used for. A "write with data-mask" command will cause memory 110 to use the signal in the ECC/DM bus as the mask value to mask the DQ value to be written to memory. A regular "Write" command will write the signal in the ECC/DM bus into the corresponding FCC block. A "read" command will output the corresponding FCC value on the ECC/DM bus. Interface 700 advantageously reduces the amount of signals required to simultaneously support ECC and data masking in a single memory interface.

Figure 7B:
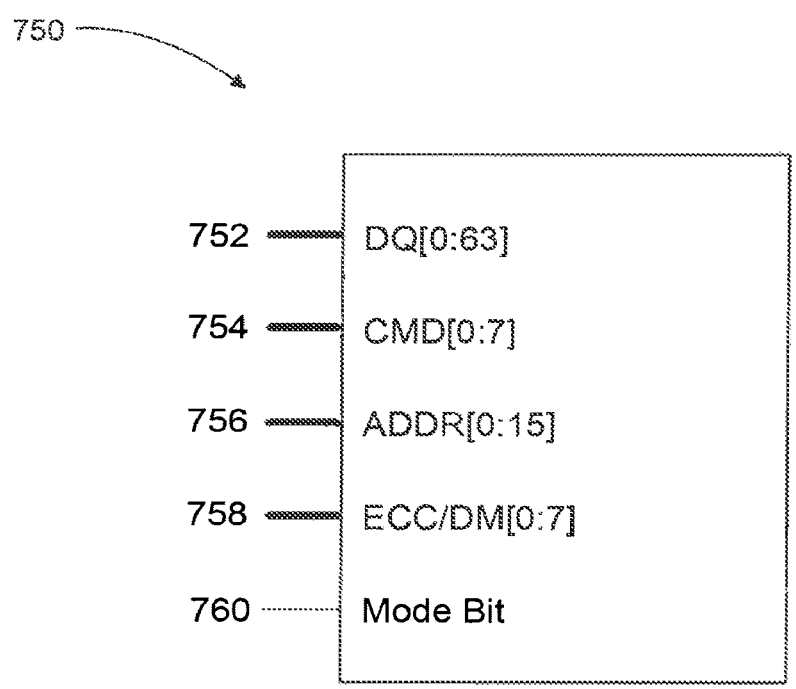
FIG. 7B is a diagram of a memory interface of a memory device supporting ECC and data-masked writes, according to an embodiment.

Referring to FIG. 7B of the drawings, reference numeral 750 illustrates an alternative interface of memory 110 which can support ECC and per-byte data masking in accordance with an embodiment. The interface 750 includes a multi-bit data bus (DQ) 752, multi-bit command bus (CMD) 754, a multi-bit address bus (AMR) 756, a multi-bit ECC/DM bus 758 and a mode bit 760. Although the memory illustrated comprises a 64-bit words size, 8-bit command, FCC and data-mask sizes and 16-bit address size, it should be understood that interface 700 could contain other bus sizes.

In an embodiment using interface 750, the value of the mode bit determines what the signals in ECC/DM bus 758 are used for. If mode bit 760 is set to "data-mask," memory 110 to use the signal in the ECC/DM bus as the mask value to mask the DQ value to be written to memory. If mode bit 760 is set to "ECC," memory 110 will write the signal in the ECC/DM bus into the corresponding FCC block. A "read" command will output the corresponding FCC value on the ECC/DM bus. Interface 750 advantageously reduces the amount of signals required to simultaneously support ECC and data masking in a single memory interface.

In an embodiment, mode bit 760, instead of an interface signal, is an internal setting written to a memory configuration register. For example, the memory mode can be set by writing the appropriate value in such a memory configuration register. In an embodiment, mode bit 760 can be set by a fuse blown at manufacturing time. These and other means to implement mode bit 760 will be understood by those skilled in the relevant arts, and are intended to be encompassed herein.

In an embodiment, memory controller 122 is configurable to operate with memory 110 through interface 700 or interface 750. Memory controller 122 may be further configured to issue different types of writes depending on the type of memory that is connected to processor 120. In an embodiment, memory controller 122 is configurable to issue writes with ECC data when a memory that supports ECC data is connected to processor 120. In an embodiment, memory controller 122 is configurable to issue writes with data-masks when a memory that does not support ECC data is connected to processor 120.

In another embodiment, memory controller 122 is configured to issue different types of writes depending on the address of the memory that is being written. In an embodiment, a memory can be divided into regions, wherein certain regions are configured to use data-masked writes and not use ECC, while other regions are configured to use ECC writes and not use data-masked writes. In certain embodiments, the regions can be defined by setting bits in an operating system's page table, where a bit indicates that a particular page is using ECC writes. In another embodiment, the regions can be configured by setting the ranges of addresses that are to use ECC or data-masking, as in a memory carve-out set up by a BIOS.

In an embodiment, memory controller 122 is configured to write ECC values on ECC memory addresses, and write data-masked values in non-ECC memory addresses. In an embodiment, memory controller 122 performs a masked write of an ECC memory address by first reading the data in the memory address and then performing an ECC write of the complete data value after the masking along with the corresponding ECC value.

Figure 8:
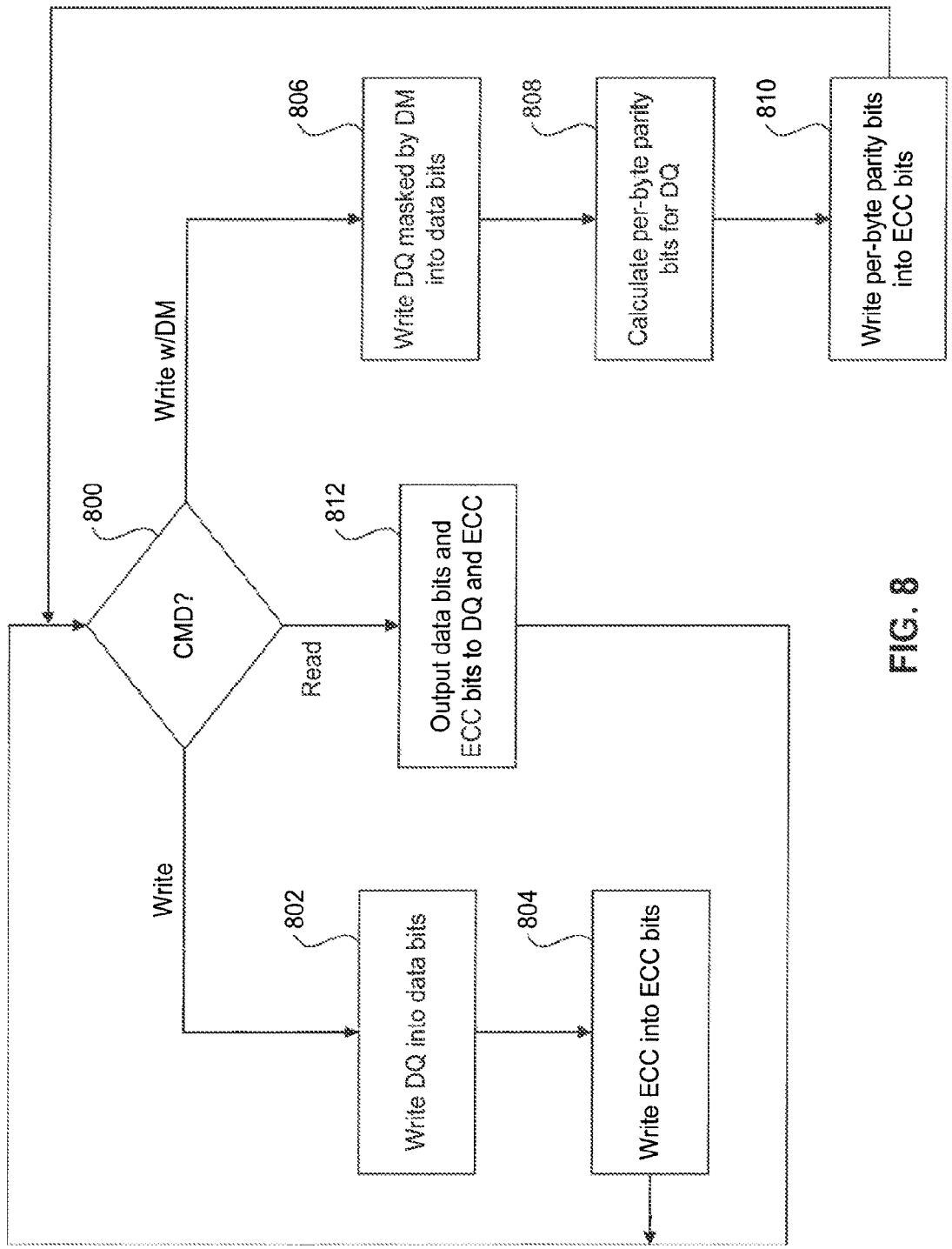
FIG. 8 is a flowchart of a method for storing ECC, data-masked and per-byte parity bits into a memory device, according to an embodiment.

FIG. 8 presents a flowchart describing various read and write operations that can be performed by memory 110 in accordance with an embodiment. At step 800, the memory waits for a command. When command bus 304 receives a regular "write" command, the memory device, at step 802, writes the signals in data bus 302 into the data blocks corresponding to the address signaled in address bus 306. At step 804, the memory device writes the signals in ECC bus 308 into the ECC blocks corresponding to the same address. Although presented as separate steps, steps 802 and 804 could occur simultaneously or in a different order than illustrated here.

When command bus 304 receives a "write with datamask" command, the memory device, at step 806, writes the signals in data bus 302 as masked by the signals in datamask bus 310 into the data blocks corresponding to the address signaled in address bus 306. At step 808, the memory device computes per-byte parity bits for the bits that are being written into the data blocks corresponding to the address. At step 810, the memory device writes the per-byte parity bits, subject to the per-byte data mask, into the ECC blocks corresponding to the same address. Although presented as separate steps, steps 806, 808 and 810 could occur simultaneously or in a different order than illustrated here.

With continuing reference to FIG. 8, if the command bus receives a "read" command, the memory device, at step 812, outputs the corresponding data bits on the DQ bus and the ECC bits on the ECC bus.

Embodiments can be accomplished, for example, through the use of general-programming languages (such as C or C++), hardware-description languages (HDL) including Verilog HDL, VHDL, Altera HDL (AHDL) and so on, or other available programming and/or schematic-capture tools (such as circuit-capture tools). The program code can be disposed in any known computer-readable medium including semiconductor, magnetic disk, or optical disk (such as CD-ROM, DVD-ROM). As such, the code can be transmitted over communication networks including the Internet and internets. It is understood that the functions accomplished and/or structure provided by the systems and techniques described above can be represented in a semiconductor device (such as a memory device) that is embodied in program code and may be transformed to hardware as part of the production of integrated circuits.

In this document, the terms "computer program medium" and "computer-usable medium" are used to generally refer to media such as a removable storage unit or a hard disk drive. Computer program medium and computer-usable medium can also refer to memories, such as system memory and graphics memory which can be memory semiconductors (e.g., DRAMs, etc.). These computer program products are means for providing software to a processor.

The embodiments are also directed to computer program products comprising software stored on any computer-usable medium, Such software, when executed in one or more data processing devices, causes a data processing device(s) to operate as described herein or, as noted above, allows for the synthesis and/or manufacture of computing devices (e.g., ASICs, or processors) to perform embodiments described herein. Embodiments employ any computer-usable or -readable medium, and any computer-usable or -readable storage medium known now or in the future. Examples of computer-usable or computer-readable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nano-technological storage devices, etc.), and communication mediums (e.g., wired and wireless communications networks, local area networks, wide area networks, intranets, etc.).

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the embodiments and the appended claims in any way.

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the embodiments should not be limited by any of the above-described exemplary embodiments, but should be defined only in accordance with the following claims and their equivalents.

What is claimed is:

1. A system, comprising:
   a processor; and
   a memory;
      wherein the memory is communicatively connected to the processor by a memory bus channel;
      wherein the memory comprises:
         a memory block comprising data bits and additional bits; and
         logic configured to:
            receive a first and a second input;
            mask data in response to the first input;
            respond to a first command, wherein the response includes:
               writing the masked data into the data bits of the memory block, and writing "don't care" values into the additional bits of the memory block; and
            respond to a second command, wherein the response includes:
               writing the data into the data bits of the memory block, and
               writing the second input into the additional bits of the memory block.

2. The system of claim 1, further comprising a memory controller;
   wherein the memory controller is communicatively connected to the processor and the memory;
   wherein the memory controller is configured to send the first command and second command to the memory.

3. The system of claim 2, wherein the logic is further configured to transmit signals to the memory controller.

4. The system of claim 2, wherein the memory controller is integral to the processor.

5. The system of claim 1, wherein the memory channel bus is a physical interface.

6. The system of claim 5, wherein the physical interface is a socket.

7. The system of claim 1, wherein the response to the first command further includes writing a per-byte parity bit into the additional bits.

8. The system of claim 1, wherein the data is masked according to a per-byte bit mask.

9. The system of claim 1, wherein the logic is further configured to respond to a third command, wherein the response includes:

outputting the data from the data bits and the additional bits.

10. The system of claim 1, wherein the memory further comprises a mode bit, and wherein the first command comprises a write command when the mode bit is set to a first value, and wherein the second command comprises the write command when the mode bit set to a second value.

\* \* \* \* \*